United States Patent [19]

Soyck

[11] Patent Number: 4,587,486
[45] Date of Patent: May 6, 1986

[54] SWITCH FOR DETECTING A MAGNETIC FIELD

[75] Inventor: Gerno Soyck, Halver, Fed. Rep. of Germany

[73] Assignee: Werner Turck GmbH & Co., KG, Halver, Fed. Rep. of Germany

[21] Appl. No.: 445,670

[22] Filed: Nov. 30, 1982

[30] Foreign Application Priority Data

Dec. 8, 1981 [DE] Fed. Rep. of Germany ....... 3148496
Dec. 8, 1981 [DE] Fed. Rep. of Germany ....... 3148529
Dec. 8, 1981 [DE] Fed. Rep. of Germany ....... 3148575

[51] Int. Cl.⁴ ................. G01N 27/72; G01R 33/12; G01B 7/14; H01F 7/06
[52] U.S. Cl. ............................ 324/236; 324/207; 324/226; 324/117 R; 324/262; 336/83; 336/233
[58] Field of Search ............... 324/117 R, 207, 208, 324/228, 229–231, 233, 234, 236–239, 240, 241, 253, 254, 255; 336/83, 233

[56] References Cited

U.S. PATENT DOCUMENTS

| | | | |
|---|---|---|---|
| 2,944,213 | 7/1960 | Foerster | 324/239 |
| 3,510,858 | 5/1970 | Hanagan | 336/83 |
| 3,541,394 | 11/1970 | Brenneman et al. | 324/207 UX |
| 3,996,510 | 12/1976 | Guichard | 324/236 X |
| 4,424,504 | 1/1984 | Mitsui et al. | 336/83 |

FOREIGN PATENT DOCUMENTS

| | | | |
|---|---|---|---|
| 1287125 | 1/1969 | Fed. Rep. of Germany . | |
| 1924279 | 6/1975 | Fed. Rep. of Germany . | |
| 2643413 | 3/1978 | Fed. Rep. of Germany | 324/236 |
| 2739967 | 3/1979 | Fed. Rep. of Germany . | |
| 2829880 | 3/1979 | Fed. Rep. of Germany . | |
| 2827951 | 6/1979 | Fed. Rep. of Germany . | |
| 2943911 | 6/1981 | Fed. Rep. of Germany . | |
| 2425648 | 5/1978 | France . | |
| 153949 | 10/1963 | U.S.S.R. | 324/236 |
| 0666597 | 6/1979 | U.S.S.R. | 324/326 |

OTHER PUBLICATIONS

Turck Catalog, Edition 10/80 (Revised 11/81).
Siemens Catalog, "Ferrite", 1982, pp. 270, 271, 336, 337, 346, 347, 402, 403 and 409.

Primary Examiner—Gerard R. Strecker
Assistant Examiner—Warren S. Edmonds
Attorney, Agent, or Firm—Antonelli, Terry & Wands

[57] ABSTRACT

A magnetic-field-dependent inductive proximity switch having a coil arrangement with a ferromagnetic core, which is saturation-sensitive with respect to the magnetic field to be picked up, and having an electronic analyzing circuit for triggering a switching process at a certain core saturation, is to be constructed so that its power requirement is very low, for example, in the range of 0.1 to 5.0 milliampere, and that, by means of said switch, a magnetic field can be picked up through a non-ferromagnetic wall and can be used to trigger switching operations. According to the invention, it is provided for this purpose that the coil arrangement is the inductive element of a high-frequency oscillatory circuit, the high-frequency oscillatory field of which, in the direction of the side of the magnetic field to be picked up, is essentially enclosed within the switch, and the oscillatory amplitude of which depends on the degree of core saturation, is picked up by the analyzing circuit, which, when an amplitude threshold value is not reached, triggers the switching operation.

7 Claims, 13 Drawing Figures

U.S. Patent  May 6, 1986  Sheet 1 of 6  4,587,486
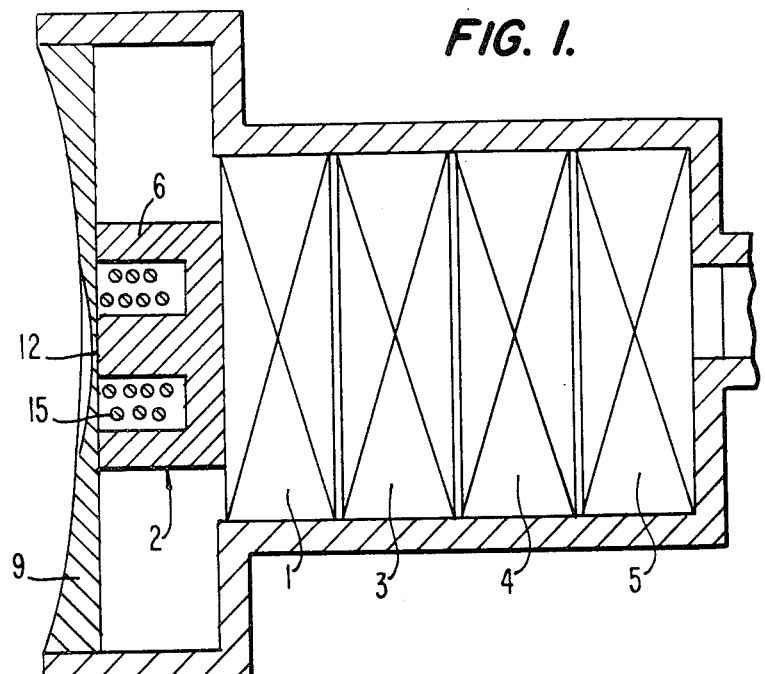
FIG. 1.
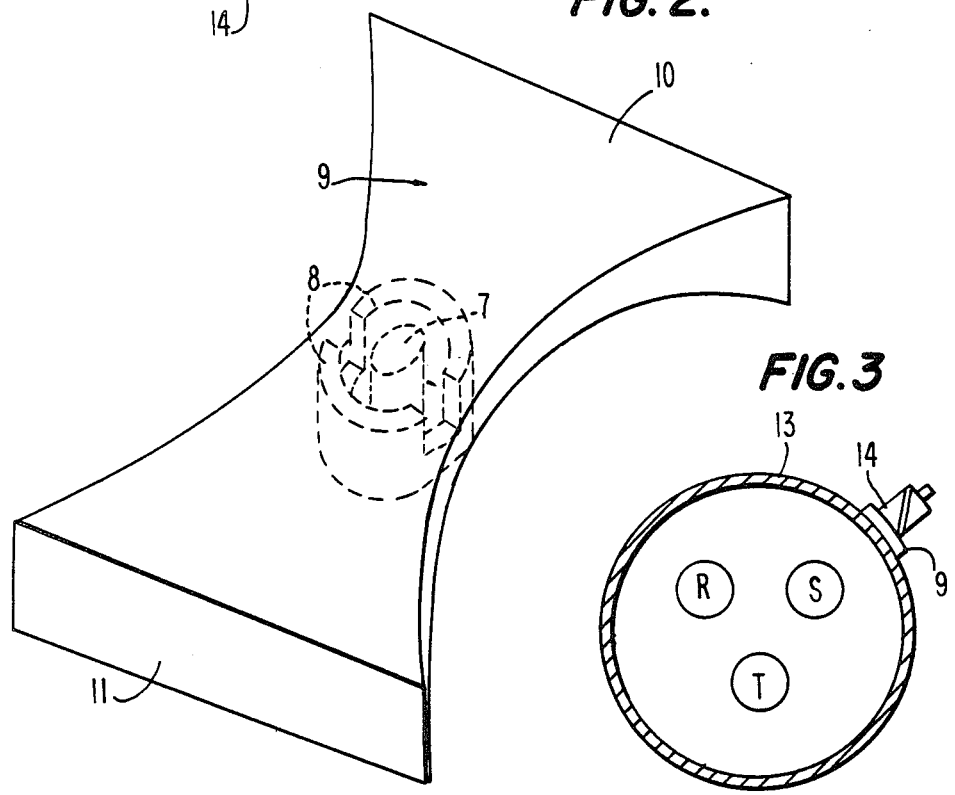
FIG. 2.
FIG. 3

SWITCH FOR DETECTING A MAGNETIC FIELD

BACKGROUND AND SUMMARY OF THE INVENTION

The invention relates to a magnetic-field-dependent inductive proximity switch having a coil arrangement with a ferromagnetic core which is saturation-sensitive with respect to the magnetic field to be picked up and having an electronic analyzing circuit for triggering a switching process at a certain core saturation.

A magnetic-field-dependent switch of this type is known on the basis of FR-OS No. 24 25 648. There the magnetic core is developed as a closed toroidal core, that is enclosed by a coil supplied with an alternating current of about 50 ma and a frequency of 10 kc/s. By means of an approaching permanent magnet, the toroidal core is driven into saturation and the inductivity is thus changed. The drop in voltage at the ends of the coil that is dependent on the inductivity is used as a signal to trigger a switching process. It is true that this switch can be triggered by a permanent magnet through a non-ferromagnetic wall, but the switch requires a high supply current. For that reason, it cannot, for example, be used in the case of complicated automatic manufacturing equipment having many hydraulic or pneumatic devices and often several hundred proximity measuring points. In addition, the construction of switches of that type is complicated.

For proximity measuring points, inductive proximity switches are known having a high-frequency oscillator, the high-frequency field of which forms a sensor field for an approaching metallic tripping device. Energy is removed from the high-frequency field by means of the entering tripping device, resulting in a damping of the oscillatory circuit and thus, in a change of the control voltage potential for the electronic switch. In the case of such proximity switches, known, for example, on the basis of DE-PS Nos. 19 24 279 and 28 27 951, however, tripping cannot take place through a metal wall, for example, through the wall of a V2A-steel (a stainless non-magnetic steel) container, because such a metal wall is no longer penetrated by the electromagnetic high-frequency field to an extent that, on the back of the metal wall, a damping or detuning of the oscillatory circuit of the proximity switch could be caused by means of a metallic lug or similar device.

On the basis of DE-PS No. 27 39 967, a proximity switch is known where the oscillatory circuit of a high-frequency oscillator is arranged in a housing in such a way that metals or other objects only cause very little damping or detuning that is not sufficient to trigger a switching process. The tripping there takes place by the proximity of a special oscillatory tripping circuit tuned to the high-frequency oscillator, whereby it is ensured, in that case, that no switching process can be triggered by arbitrary foreign objects. This known proximity switch, comprising two high-frequency oscillators, also cannot be used as a switch that operates through a metal wall since the high-frequency fields on both sides would be damped or cut off in an interfering manner by means of such a metal wall.

From DE-PS No. 28 29 880, an electronic non-contact safety switch having an oscillator that can be influenced from the outside is also known, where the tripping element is a dish-shaped ferrite core forming the counterpart to the ferrite core of the oscillator. In this case, the reaction impedance is adjusted so that the amplitude of the oscillation is very small. When a metal part enters into the high-frequency field, the oscillations break off in the conventional manner which, in this case, however, is not used to generate a signal. When, in this case, the tripping ferrite core enters the high-frequency field, the amplitude of the oscillation rises so much that an output relay responds. This safety switch also cannot be used in cases where switching operations are to be triggered through a metal wall.

The invention is based on the task of creating a magnetic-field-dependent switch with a low power requirement, for example, in the range of from 0.1 to 5.0 milliampere, by means of which a magnetic field is picked up through a non-ferromagnetic wall and can be utilized for triggering switching operations.

In order to solve this problem, it is provided, according to the invention, that the coil arrangement is the inductive element of a high-frequency oscillatory circuit, the high-frequency oscillatory field of which, in the direction of the side of the magnetic field to be picked up, is essentially enclosed within the switch, and the amplitude of oscillation of which, which depends on the degree of core saturation, is picked up by the analyzing circuit which triggers the switching process when an amplitude threshold is not reached.

The switch according to the invention has the advantage that it can be manufactured cost-effectively and requires a low supply current in the range of 0.1 to 5 milliampere. Since the oscillator vibrations suddenly break off at a certain core saturation, the switch can be constructed to have high response precision. Since the switch can be operated through non-ferromagnetic walls, it offers new possibilities for usage as a proximity switch.

In the case of the switch according to the invention, the oscillatory circuit preferably has a coil-closing shell-type core or ferrite pot having center pockets as they are known in the conventional inductive non-contact proximity switches. According to the invention, the enclosure of the high-frequency oscillatory field can be achieved in various ways. According to one embodiment, the ferrite pot, at its open side, may be closed by a diametral short-circuit yoke. Said short-circuit yoke may consist of an identical ferrite pot, with both ferrite pots, with their open sides being placed against one another. However, the short-circuit yoke may also be plate-shaped, project above the ferrite pot on both sides, and provided with widened ends for the intensified trapping of an external magnetic field, and in its central area, may have a narrowing point of the cross section. An especially saturation-sensitive point, therefore, exists at this narrowing point of the cross section in the closed magnetic circuit.

As an alternative, the enclosure of the high-frequency oscillatory field may also be achieved by the fact that the oscillatory field of the oscillatory circuit is protected toward the outside against the effect of metals by a large mechanical casing. In this case, the ferrite pot may, for example, with its open side, point in the direction of the inside of the housing, in which case, its bottom will then point to the side of the magnetic field to be picked up. According to the invention, it is also possible to dispose the magnetic core eccentrically in the mechanical casing so that, in one or several approach (proximity) directions, it can be driven into saturation by a trip magnet.

According to another characteristic of the invention, the magnetic core may also be provided with one or several constrictions for the local increase of the magnetic flux density. Advantageously, the magnetic core may be provided with said constriction at the transition from the central part to the bottom. However, it is sufficient if only a small partial area of the oscillatory magnetic field circuit is brought into saturation.

In a further development of the invention, it may be provided that an external electromagnet or permanent magnet is disposed at a fixed distance is assigned to the switch as a trip magnet, and that a movable ferromagnetic short-circuiting bridge for the shielding or release of the magnetic field of the trip magnet is provided between the switch and the trip magnet as the actual switching trigger.

According to the invention, the magnetic-field switch may, at the same time, be developed as an inductive proximity switch that responds to the approach of a metal lug at its active surface, with said proximity switch, with another surface than the active surface, being able to be mounted on a non-ferromagnetic metal wall without affecting the oscillatory circuit, in which case, a tripping device for the approach to that other surface in the form of an electomagnet or a permanent magnet is then assigned to the proximity switch, with the electromagnet or permanent magnet being of such intensity that, at a certain proximity, it drives the magnetic core into saturation. In this case, the switch may be designed for an OR-operation or for an AND-operation. In the latter case, the switch will only trigger a switching process if an approach of metal takes place on the one side, and, at the same time, the approach of a sufficient magnetic field takes place on the other side. An AND-operation is advantageous in the case of safety circuits, for example, in the case of presses or elevators.

By means of the invention, the effect of external magnetic fields which, until now, in the case of inductive proximity switches, has only been known as a dangerous interfering influence, is being utilized in order to be able to dampen the oscillator circuit through a separating metal wall for the purpose of triggering directed switching processes. In regard to its operational possibility, the switch according to the invention can be compared with a Reed contact switch, in which case, the disadvantages of the Reed contact switch, namely, a possible faulty operation in the case of mechanical vibrations or a possible sticking of the contacts, however, are avoided. When using a permanent magnet, it is advantageous that it is a passive part, in this case, that does not require its own power supply. Another significant advantage of the magnetic-field switch according to the invention is the fact that it, if it is only to be operable by a trip magnet or an external magnetic field, can now be completely enclosed in a metal housing, for example, consisting of corrosion-resisting V2A-steel, so that the switch can be made completely insensitive with respect to attacks by corrosion, flying sparks, high hydraulic pressures, etc. The switch is also insensitive to magnetic overload. For the construction of the magnetic switch according to the invention, practically any known type of inductive proximity switch can be used as a basis, for example, direct-current (DC), alternating-current (AC), alternating-current/direct-current or NAMUR-types.

Finally, the switch according to the invention may also be used as excess current delay (overload relay) in the case of high-voltage lines.

These and further objects, features and advantages of the present invention will become more obvious from the following description when taken in connection with the accompanying drawings which show, for purposes of illustration only, several embodiments in accordance with the present invention.

BRIEF DESCRIPTION OF THE DRAWINGS

FIG. 1 shows a switch according to the invention;

FIG. 2 shows a perspective view of the ferrite core of the switch according to FIG. 1;

FIG. 3 shows a possible use of the magnetic switch according to FIG. 1;

DETAILED DESCRIPTION OF THE PREFERRED EMBODIMENTS

Figure 4:
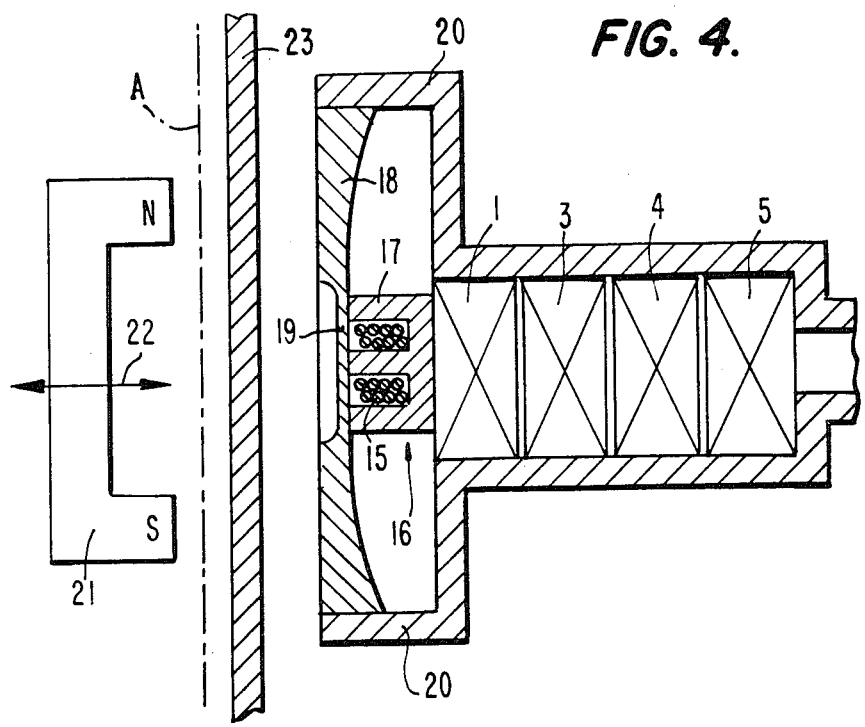
FIG. 4 shows a switch according to the invention developed as a proximity switch.

FIG. 1 shows a switch that is constructed largely on the basis of an inductive proximity switch, as it is described, for example, in DE-AS No. 29 43 911. In its basic structure, the switch 14, like that of DE-AS No. 29 43 911, is comprised of an oscillatory circuit 1 having a ferrite core 2, a switching amplifier 3, an electronic switching element 4, such as, for example, a transistor, thyristor or triac, and a supply circuit 5 for generating the supply voltage for the oscillator 1 and the switching amplifier 3. The frequency of the oscillator is between 50 kc/s and 5 MC/s.

The ferrite core 2 consists of a shell-type core or ferrite can 6 having a central pole 7, two external poles 8 and a short-circuit yoke 9, yoke 9 bridges the ferrite pot 6, which projects far above the ferrite can on both ends, and, at its ends 10, 11, is considerably widened and also thickened. The yoke 9, in the middle area, is narrowed to about the outside diameter of the ferrite pot 6, and, in its central area, is provided with an especially thin, saturation-sensitive point 12, where the material thickness of the yoke only amounts to, for example, a few tenths of a millimeter. In regard to yoke 9, it is noted that the switch of the present invention differs from that of DE-AS No. 29 43 911 in not only its physical shape, but also its composition. That is, yoke 9 is shaped to provide a saturation-sensitive point and is formed of a magnetic or magnetizable material (such as iron or preferably ferrite), so as to lock in the electromagnetic field, thereby creating a closed magnetic flux through pot 6 and yoke 9 of increased strength. As a result, the magnetic field is not affected by a metal wall, a magnetic field being required to actuate the switch by damping the oscillator. In contrast, the switch of DE-AS No. 29 43 911 uses, instead of yoke 9, a uniform thin shield of electrical conducting, non-magnetizable material, such as graphite or a foil of aluminum or copper; however, such a shield is only effective against foreign AC fields, and does not confine the electromagnetic field of the oscillator of the switch.

FIG. 3 shows the use of the magnetic switch as an excess current relay (overload relay) in the case of, for example, a 100,000 V line, where the three bus bars R,S and T extend in an aluminum pipe 13 containing silicon hexafluoride. In this case, the switch 14, by means of its short-circuit yoke 9, is placed on the aluminum pipe 13. By means of its longitudinal axis, the short-circuit yoke is aligned in circumferential direction of the pipe 13 and is thus aligned optimally with respect to collecting the ring-shaped magnetic fields of the bus bars R,S and T. In the case of an undisturbed operation, the oscillator vibrates, in which case its electromagnetic oscillatory field extends essentially only within the ferrite core 2 completely enclosing the coil 15. Because of the narrowing of the cross section, there will then, in the central area of the yoke 9, already be a relatively high flux density which, however, does not yet cause a saturation. If a certain excess current or a short-circuit occurs at the high-voltage contact, the short-circuit yoke 9 collects the resulting intensified magnetic field, which, because of the narrowing of the cross section in the central area of the short-circuit yoke 9, results in such a high flux density that a saturation takes place there. Consequently, the oscillatory circuit is detuned to such an extent that the electronic analyzing circuit 3, 4, 5, connected at the outer side, furnishes a switching signal. Since the coil arrangement 16, consisting of the magnetic core 2 and the coil 15, is the inductive element of an oscillatory circuit, the switch has a high sensitivity and precision in regard to response. In the case of the described usage, shell-shaped ferrite cores or ferrite pots 6 having an outside diameter of only 5.5 mm may be used and the whole switch may, therefore, be designed to be very small.

FIG. 4 shows a switch, the core of which again consists of a ferrite pot 17 and a magnetic short-circuit yoke 18 having a narrowing 19 of the cross section in the central area. A trip magnet 21 is assigned to the switch 20 and is movable in the direction of the arrow 22 toward and away from the short-circuit yoke 18. The magnet 21 has such field intensity that, when the response range A is exceeded, the core, again in the area of the narrowing 19 of its cross section, is driven into saturation causing a switching signal. Because of the enclosure of the oscillatory field within the ferrite pot 17 and the short-circuit yoke 18, the switch is insensitive with respect to the proximity of non-ferromagnetic metal. This means that the switch 20 can be triggered by the magnet 21 also through a non-ferromagnetic metal wall, for example, a V2A container wall 23.

Figure 5:
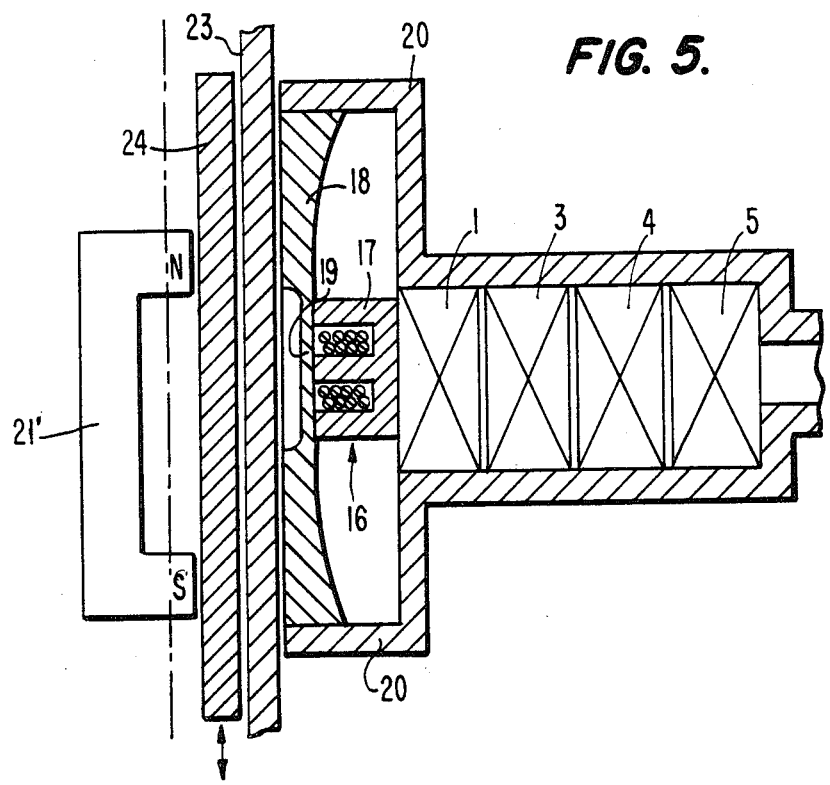
FIG. 5 shows a modified embodiment of a switch according to the invention developed as a proximity switch.

In the embodiment according to FIG. 5, the same permanent magnet 21', as in the embodiment according to FIG. 4, is assigned to the switch 20, with said permanent magnet 21', in this case, being mounted in a stationary manner within the response zone A. A movable plate 24 consisting of a ferromagnetic material is disposed between the trip magnet 21' and a non-ferromagnetic metal wall 23. With the plate 24, in the indicated position according to FIG. 5, the magnetic field of the permanent magnet 21' is short-circuited, so that the oscillator can vibrate with its normal frequency. When the ferromagnetic plate 24 is pulled away, the permanent magnet 21' immediately drives the narrowed cross section area 19 into magnetic saturation.

Figure 6:
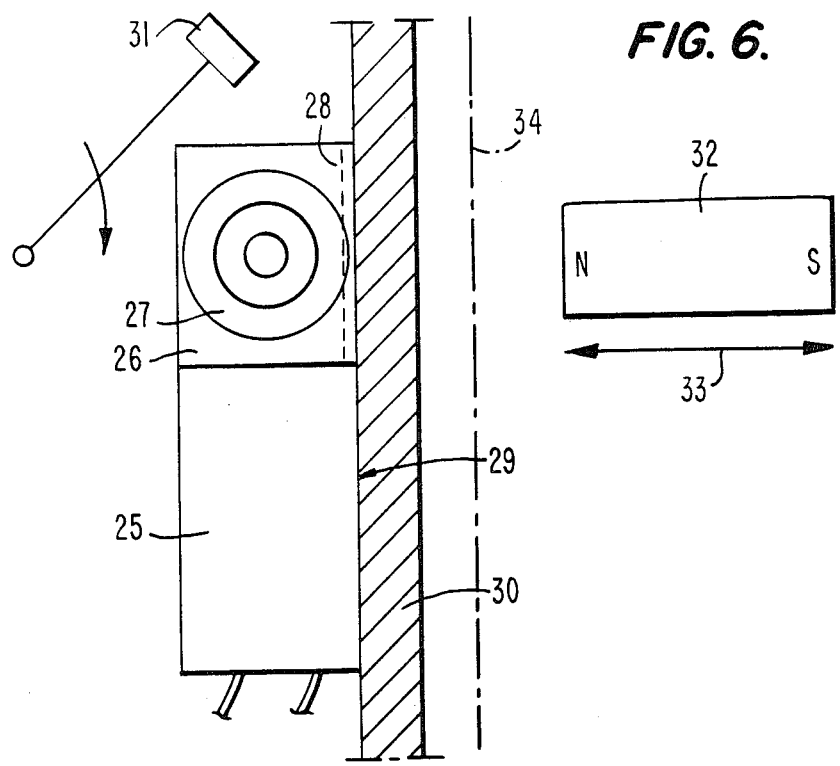
FIG. 6 shows a conventional inductive proximity switch which, at the same time, is developed as a magnetic-field switch according to the invention.

FIG. 6 shows an inductive proximity switch 25 with a head 26 in which an oscillatory-circuit coil having a ferrite core is disposed so that a high-frequency field is located in front of the illustrated active face 27. The oscillatory circuit of the proximity switch is provided with a lateral shield 28 and is arranged and tuned in such a way that the proximity switch 25, with a face 29 other than its active face 27, can be mounted on a metal wall 30, for example, a container wall made of V2A-steel, without damping or affecting the oscillatory circuit to an extent that a switching command is triggered. A switching process is rather triggered in the conventional manner by the entering of a metal piece or a metal lug 31 into the high-frequency field in front of the active face 27.

A second tripping device in the form of a trip magnet 32 is assigned to the proximity switch according to FIG. 6. This trip magnet 32 may be either a permanent magnet or an electromagnet. The trip magnet 32 may be arranged on the other side of a non-ferromagnetic metal wall 30 and is moved, by the machine part or similar object to be monitored, in the direction of the double arrow 33 toward and away from the wall 30 or the face 29 of the switch. When a certain response line 34 is crossed, the relatively strong trip magnet 32 drives the ferrite core of the switch 25 into saturation, so that the oscillations are damped and a switching process is triggered.

Figure 7:
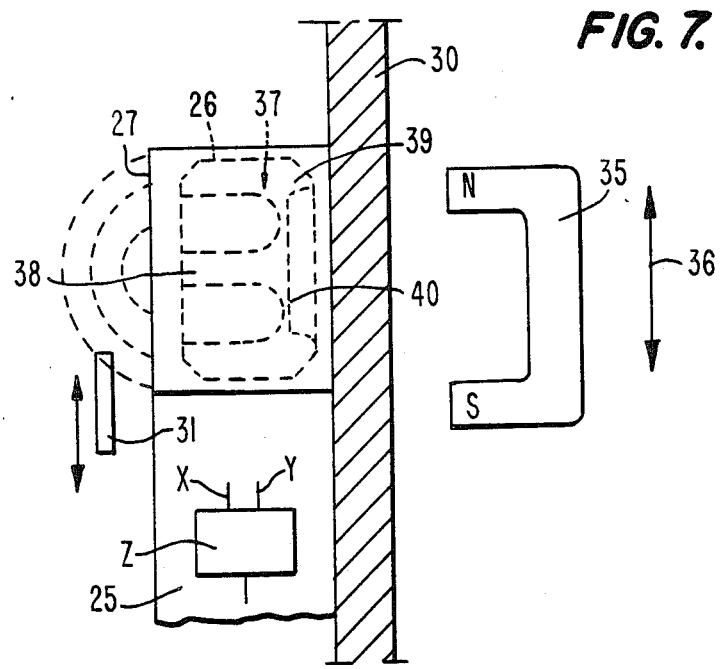
FIG. 7 shows the inductive proximity switch according to FIG. 6 in a different mounting position, in which it also can be operated at the same time as a magnetic-field switch according to the invention.

In the case of the embodiment according to FIG. 7, the head 26 of the proximity switch 25 is turned by 90° so that its active face 27 is now opposite the metal wall 30. By means of a metal lug 31 entering into the high-frequency field, a first trip signal X can be generated here. Another trip signal Y takes place by means of the trip magnet 35 disposed on the back of the metal wall 30, with the trip magnet 35 being shown here as a U-shaped permanent magnet which may approach parallel (Double Arrow 36) or normal to the wall 30. The shell-shaped ferrite core 37, in this case, at the transition from its central part 38 to its bottom 39, is provided with a narrowing of its cross section 40, where the ferrite core, at a certain proximity to the trip magnet 35, is subjected to a magnetic saturation which triggers a switching process. Naturally, the magnetic core may also have narrowings of its cross section at other points, for example, at its poles or at the transition from the bottom to the edge part, in order to increase local magnetic flux density. The signals X and Y are supplied to an AND-element Z, the output of which only triggers an activation of the electronic switch.

In the development of the shell-shaped ferrite core according to FIG. 7, there is no short-circuit yoke 9, or 18 according to FIGS. 1 to 5.

So-called Q-, X- or RM-cores may also be used instead of the shell-shaped ferrite cores.

In cases where a double tripping possibility, especially a tripping by means of an arbitrary metal piece, is not supposed to exit, the high-frequency field located in front of the active face 27 is advantageously mechanically enclosed by a cap so that an entering of the metal lug 31 or similar device into the high-frequency field is no longer possible.

Figure 8:
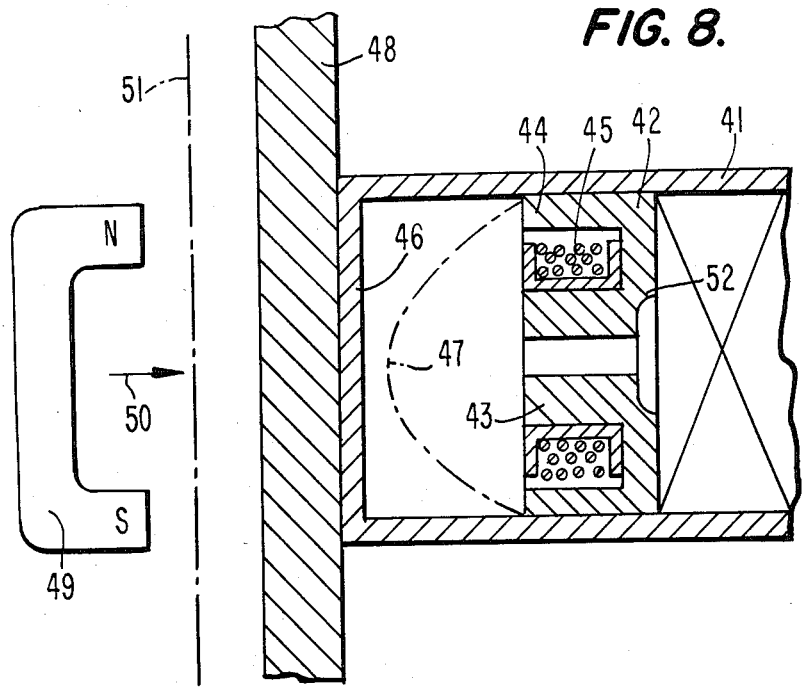
FIG. 8 shows the front response part and triggering part of another embodiment of the proximity switch according to the invention.

FIG. 8 shows another embodiment of the front part of a housing 41 of a proximity switch consisting of plastic or metal, where the high-frequency oscillator, as the magnetic core, has a shell-shaped ferrite core 42, between the central part 43 and marginal part 44 of which a coil 45 is included. The ferrite core 42 has its open side directed toward the front side 46 of the housing 41 and is spaced away from the front side 46 to an extent that its high-frequency field (apart from a weak stray field) is located within the housing 41.

The oscillatory circuit of the high-frequency oscillator can, therefore, no longer be damped by means of a tripping metal piece to an extent that the oscillations break off and a switching of the electronic switch is triggered, but, for this purpose, a metal part would have to be able to approach to the dash-dotted response line 47.

In view of this insensitivity with respect to external metals, the proximity switch can now have its front wall 46 placed at a metallic wall 48, for example, a container wall made of V2A-steel, without causing a triggering of the switching operation in the case of the proximity switch.

The triggering of the proximity switch takes place by means of a trip magnet 49 which, in the case of this embodiment, is a U-permanent magnet which approaches the front wall 46 in the direction of the Arrow 50. By means of this relatively strong trip magnet 49, the magnetic flux in the ferrite core 42 is increased and at a proximity to, for example, the response line 51, a switching signal is triggered. In order to increase sensitivity, the ferrite core 42, at the transition point from the central part 43 to the bottom, is provided with a narrowing 52, within which the ferrite core 42 can be driven into saturation relatively fast. Naturally, the magnetic core may also be provided with narrowings of the cross section at other points, for example, at its poles or at the transition from the bottom to the edge part, in order to increase local magnetic flux density.

Figure 9:
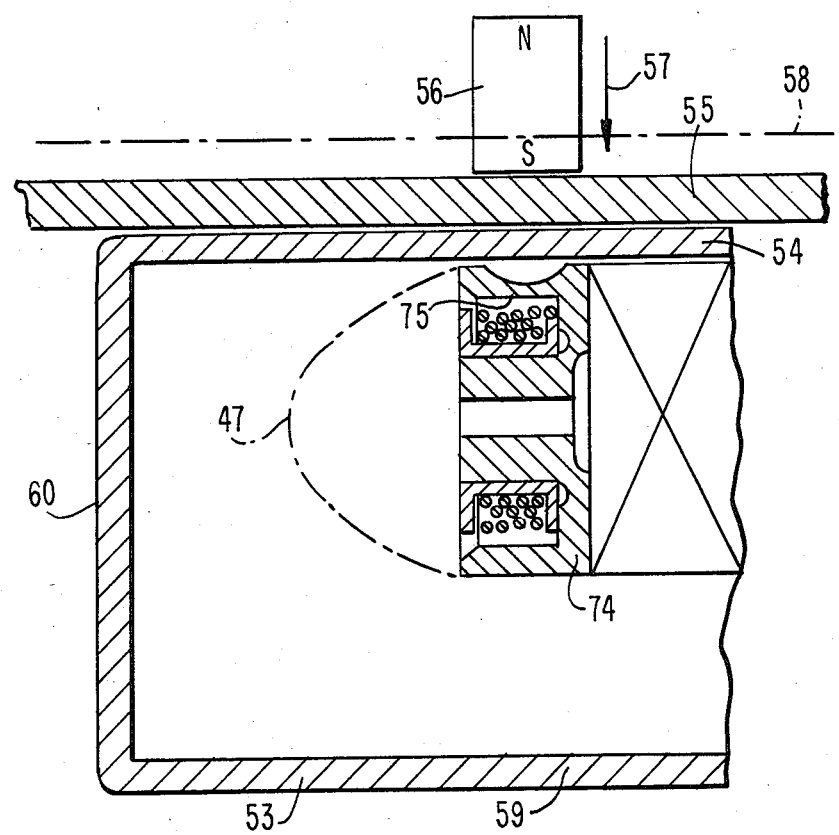
FIGS. 9 and 10 show two other modified embodiments of the front response and triggering part of a proximity switch.

In the case of the embodiment according to FIG. 9, the ferrite core 42 is located eccentrically in a relative wide housing 53, in which case its high-frequency field, that can be influenced by a metal lug, is again enclosed in the housing 53. In this case, the ferrite core 74 is disposed closely at a longitudinal side 54 of the housing of the proximity switch and is there, at its casing, provided with a saturation-sensitive point 75. With this side 54 of the housing, the switch is disposed at a metal plate 55, on the other side of which, a rod-shaped permanent trip magnet 56 approaches in the direction of the Arrow 57 and thus radially with respect to the ferrite core 74. The magnetic trip core 56 and the ferrite core 74 are coordinated with one another so that, when the response line 58 is exceeded, a switching operation is triggered. Since the distance of the ferrite core 74, from the opposite longitudinal wall 59 of the side of the housing or the front wall 60, is larger than the distance of the response line 58, from the ferrite core 2, the proximity switch can perferably only be triggered by the magnet 56 in the case of an approach from one side of the switch.

Deviating from the representations in the drawing, it can be provided in all embodiments that the coil arrangement of the oscillatory circuit is spaced from the other parts 1, 3, 4, 5 of the analyzing circuit, so that the coil arrangement is connected only by means of two correspondingly long electrical lines with the analyzing circuit. The coil arrangements, which measure only a few millimeters, can, therefore, also be mounted in the case of narrow conditions of installation and may also be disposed narrowly next to one another.

Figure 10:
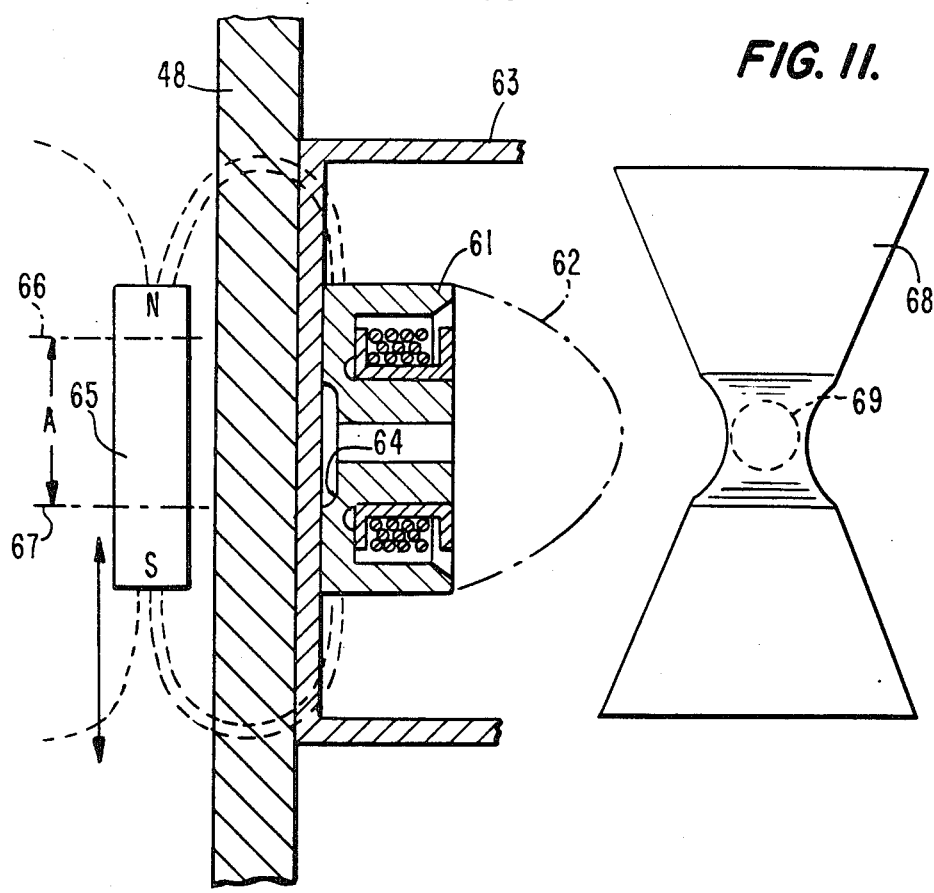

FIG. 10 shows an embodiment where the ferrite can 61, with its open side, points to the inside of the housing so that its high-frequency oscillatory field 62 is enclosed within the housing 63. The ferrite can 61, at its bottom facing the magnetic field to be picked up, has a narrowing of its cross section 64, where, by means of a trip magnet 65, it is driven into saturation when the response distances 66 or 67 are exceeded.

Figure 11:
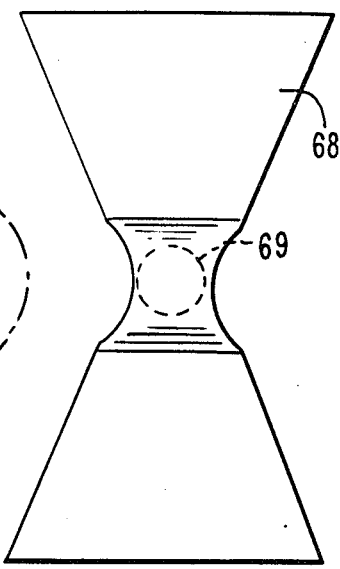
FIG. 11 shows another embodiment of a short-circuit plate.

FIG. 11, in plan view, shows a plate-shaped short-circuit yoke 68, which is narrowed in the center to the diameter of the shaded center pocket 69 of a ferrite pot 6, so that there exists an especially high magnetic flux density and thus an especially saturation-sensitive point, and which is interchangeable with either of yokes 9, 18.

Figure 12:
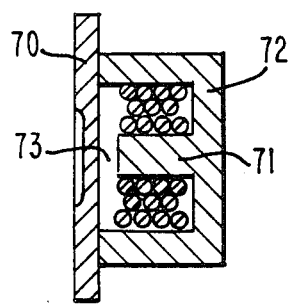
FIG. 12 shows a modified embodiment with an air gap in the magnetic circuit.

FIG. 12 shows a modification where a narrow air gap 73 is provided between the yoke plate 70 of the magnet and the center pocket 71 of the ferrite core 72. In this case also, a tripping is possible by means of a correspondingly strong external magnet.

Figure 13:
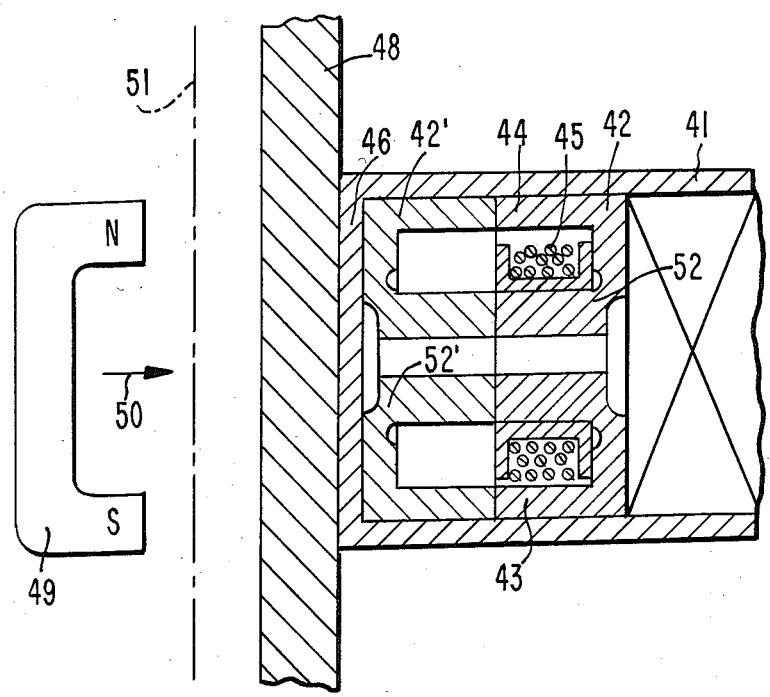
FIG. 13 illustrates a modified version of the FIG. 8 embodiment.

In FIG. 13, a modified version of the FIG. 8 embodiment is shown, like reference numerals designating common components. In this embodiment, a ferrite pot 42' (which is identical to ferrite pot 42) is placed between wall 46 and pot 42 with its open end placed against the open end of pot 42. Pot 42' serves as a short-circuit yoke, similar to yokes 9, 18 and 68, for creating a close magnetic flux path.

While I have shown and described various embodiments in accordance with the present invention, it is understood that the same is not limited thereto, but is susceptible of numerous changes and modifications as known to those skilled in the art, and I, therefore, do not wish to be limited to the details shown and described herein, but intend to cover all such changes and modifications as are encompassed by the scope of the appended claims.

I claim:

1. A magnetic-field-dependent inductive proximity switch, comprising a core which is saturation-sensitive to a magnetic field to be detected, a high-frequency oscillator circuit having an oscillator coil for producing an electromagnetic oscillatory field in said core, and an electronic analyzing circuit coupled to said oscillator for detecting detuning of said oscillator due to saturation of said core and for triggering a switching process in response to said detecting at a certain core saturation characterized in that the core comprises a closed ferrite core which completely surrounds said oscillator coil so that a magnetic field produced in the magnetic core material of said core by said oscillator circuit is completely enclosed, and said core having an especially saturation-sensitive narrowed cross section at at least one point.

2. A proximity switch according to claim 1, wherein said ferrite core comprises a shell-type ferrite can having an open end with a pocket for said coil defined between a central pole and two external poles, said ferrite can being short-circuited at its open end by a yoke to form said closed ferrite core.

3. A proximity switch according to claim 2 wherein said short-circuit yoke projects beyond said ferrite can on both sides of said can and is provided with expanded ends for amplified reception of an external magnetic field, and wherein said yoke has a saturation-sensitive narrowed cross section in its central area.

4. A proximity switch according to claim 1, wherein said closed ferrite core comprises two identical ferrite cans, which have their open ends facing one another.

5. A proximity switch according to claim 1, wherein said closed ferrite core comprises a shell-type ferrite can having an open end with a pocket for said coil, said ferrite can being provided with a narrowed cross section at a transition between a central part of the can and a can bottom.

6. A proximity switch according to claim 1, wherein an external electromagnet or permanent magnet is disposed at a fixed distance from said proximity switch and serves as a triggering magnet, a movable ferromagnetic short-circuit bridge being provided to shield or expose the magnetic field of the triggering magnet between said proximity switch and said triggering magnet as a switch-triggering device.

7. A proximity switch according to claim 1, wherein said proximity switch is disposed adjacent at least one current conducting line to serve as an excess-current-monitoring device.

* * * * *